(12) United States Patent
Yen et al.

(10) Patent No.: US 11,749,619 B2
(45) Date of Patent: Sep. 5, 2023

(54) PACKAGE SUBSTRATE AND METHOD FOR MANUFACTURING THE SAME

(71) Applicants: Advanced Semiconductor Engineering, Inc., Kaohsiung (TW); Phoenix Pioneer Technology Co., Ltd., Hsinchu County (TW)

(72) Inventors: You-Lung Yen, Kaohsiung (TW); Pao-Hung Chou, Hsinchu County (TW); Chun-Hsien Yu, Hsinchu County (TW)

(73) Assignees: ADVANCED SEMICONDUCTOR ENGINEERING, INC., Kaohsiung (TW); PHOENIX PIONEER TECHNOLOGY CO., LTD., Hsinchu County (TW)

( * ) Notice: Subject to any disclaimer, the term of this patent is extended or adjusted under 35 U.S.C. 154(b) by 50 days.

(21) Appl. No.: 16/824,425

(22) Filed: Mar. 19, 2020

(65) Prior Publication Data
US 2021/0296259 A1 Sep. 23, 2021

(51) Int. Cl.
| H01L 23/00 | (2006.01) |
| H01L 23/31 | (2006.01) |
| H01L 23/14 | (2006.01) |
| H01L 23/498 | (2006.01) |
| H01L 21/48 | (2006.01) |
| H01L 21/56 | (2006.01) |
| H01L 21/683 | (2006.01) |

(52) U.S. Cl.
CPC ........ *H01L 23/562* (2013.01); *H01L 21/4853* (2013.01); *H01L 21/565* (2013.01); *H01L 21/6835* (2013.01); *H01L 23/145* (2013.01); *H01L 23/3128* (2013.01); *H01L 23/49838* (2013.01); *H01L 24/16* (2013.01); *H01L 2224/16227* (2013.01); *H01L 2924/3511* (2013.01); *H01L 2924/35121* (2013.01)

(58) Field of Classification Search
None
See application file for complete search history.

(56) References Cited

U.S. PATENT DOCUMENTS

| 8,569,894 B2 | 10/2013 | Su et al. |
| 10,440,819 B2 | 10/2019 | Vincent |

(Continued)

OTHER PUBLICATIONS

Non-Final Office Action for U.S. Appl. No. 16/824,423, dated Apr. 27, 2021, 16 pages.

*Primary Examiner* — Jay C Chang
(74) *Attorney, Agent, or Firm* — FOLEY & LARDNER LLP

(57) ABSTRACT

A package substrate and method of manufacturing a package substrate and a semiconductor device package are provided. The package substrate includes a circuit layer, a molding layer and a sacrificial layer. The circuit layer includes conductive traces and conductive pads. The molding layer has an upper surface and a lower surface opposite to the upper surface, wherein the molding layer partially covers the conductive traces and the conductive pads, and first surfaces of the conductive traces and first surfaces of the conductive pads are exposed from the upper surface of the molding layer. The sacrificial layer covers the lower surface of the molding layer, second surfaces of the conductive pads.

13 Claims, 19 Drawing Sheets

(56) References Cited

U.S. PATENT DOCUMENTS

| | | | |
|---|---|---|---|
| 2002/0066672 A1* | 6/2002 | Iijima | H05K 3/045 |
| | | | 205/125 |
| 2003/0111734 A1* | 6/2003 | Kobayashi | H01L 23/5383 |
| | | | 257/E23.06 |
| 2008/0105967 A1 | 5/2008 | Yang et al. | |
| 2009/0236738 A1 | 9/2009 | Shim et al. | |
| 2011/0027945 A1* | 2/2011 | Saitou | H01L 24/16 |
| | | | 438/125 |
| 2011/0220397 A1* | 9/2011 | Mizukoshi | H05K 3/4694 |
| | | | 156/154 |
| 2011/0291551 A1* | 12/2011 | Tamekawa | H01L 51/529 |
| | | | 313/504 |
| 2014/0070396 A1* | 3/2014 | Kyozuka | H01L 24/19 |
| | | | 257/698 |
| 2015/0348895 A1* | 12/2015 | Sen | H01L 21/56 |
| | | | 174/251 |
| 2016/0133562 A1 | 5/2016 | Lee et al. | |
| 2016/0225708 A1* | 8/2016 | Chen | H01L 21/4857 |
| 2016/0322295 A1 | 11/2016 | Kobayashi et al. | |
| 2018/0366411 A1 | 12/2018 | Suk et al. | |
| 2020/0144168 A1 | 5/2020 | Lu et al. | |
| 2020/0176384 A1* | 6/2020 | Wu | H01L 21/4857 |
| 2020/0335441 A1* | 10/2020 | Kim | H01L 21/4857 |

\* cited by examiner

PACKAGE SUBSTRATE AND METHOD FOR MANUFACTURING THE SAME

BACKGROUND

1. Technical Field

The present disclosure relates to a package substrate and manufacturing method thereof, and more particularly, to a package substrate with thin thickness and sufficient structural strength and manufacturing method thereof.

2. Description of the Related Art

As compact size and high performance have become typical requirements of consumer electronic and communication products, semiconductor device packages are expected to possess superior electrical properties, thin overall thickness and a large number of I/O ports. In order to provide sufficient structural strength for supporting semiconductor dies and electronic components formed thereon, the package substrate needs to be thick enough. Normally, the thickness of the package substrate needs to exceed 100 micrometers to provide sufficient structural strength. The thick thickness of the package substrate, however, increases the overall thickness of the semiconductor device package.

It is therefore desirable to develop a package substrate with thin thickness but sufficient structural strength to meet the compactness requirement of consumer electronic and communication products.

SUMMARY

One aspect of the present disclosure relates to a package substrate. In some embodiments, the package substrate includes a circuit layer, a molding layer and a sacrificial layer. The circuit layer includes conductive traces and conductive pads. The molding layer has an upper surface and a lower surface opposite to the upper surface, wherein the molding layer partially covers the conductive traces and the conductive pads, and first surfaces of the conductive traces and first surfaces of the conductive pads are exposed from the upper surface of the molding layer. The sacrificial layer covers the lower surface of the molding layer, second surfaces of the conductive pads.

Another aspect of the present disclosure relates to a method of manufacturing a package substrate. In some embodiments, the method includes the following operations. A circuit layer is formed, wherein the circuit includes conductive traces and conductive pads. A molding layer is formed to cover the conductive traces and the conductive pads. The molding layer is thinned to expose the conductive pads. A sacrificial layer is formed on the molding layer and on the exposed conductive pads.

Another aspect of the present disclosure relates to a method of manufacturing a semiconductor device package. In some embodiments, the method includes the following operations. The above-mentioned package substrate is provided. A die is disposed on the molding layer electrically connected to the conductive traces. A second molding layer is formed on the molding layer to encapsulate the die. The sacrificial layer is removed from the molding layer and the exposed conductive pads. A plurality of electrical conductors is formed on the exposed conductive pads.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
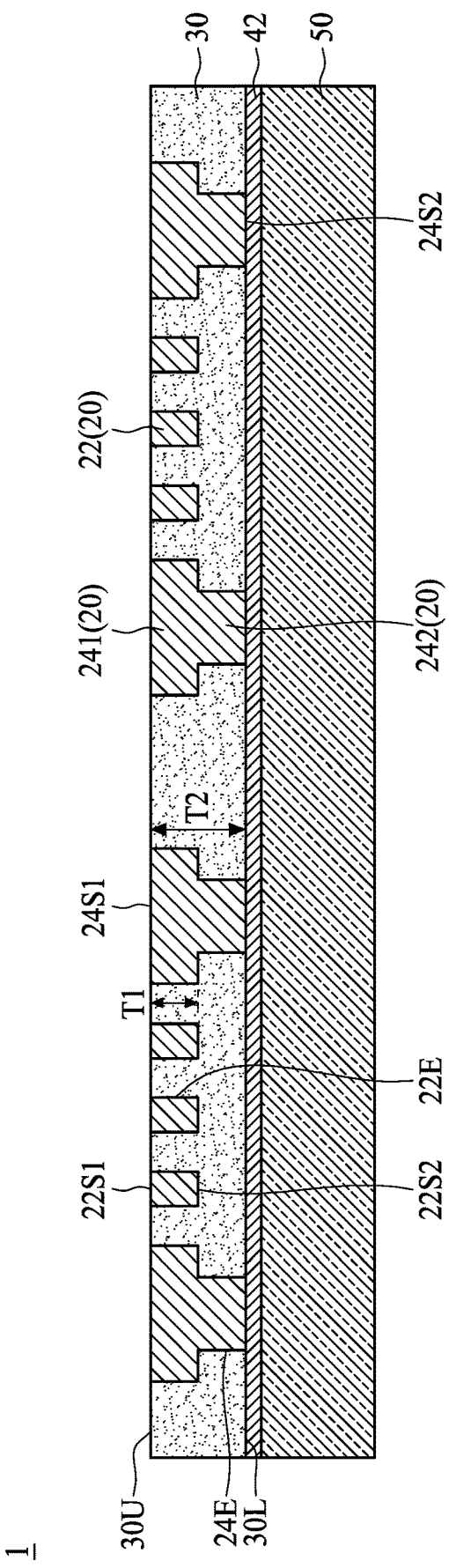
FIG. 1 is a schematic cross-sectional view of a package substrate in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosures provide package substrates with thin thickness and strong robustness. The package substrate may be configured to support semiconductor dies and/or electronic components, and to electrically connect the semiconductor dies and the electronic components to external electronic device such as printed circuit board. The package substrate may be an intermediate product, which includes a sacrificial layer temporarily supporting a circuit layer. The sacrificial layer can enhance the structural strength of the package substrate, and can be easily removed after the semiconductor die and/or electronic component are formed and encapsulated by an encapsulant. Accordingly, the overall thickness of the final product such as a semiconductor device package can be reduced. The package substrate includes a molding layer configured as a dielectric base of the package substrate. The molding layer and the encapsulant may be made of homogeneous molding material, and thus the molding layer and the encapsulant includes a homogeneous interface. Accordingly, the reliability of the bonding between the molding layer and the encapsulant is ensured.

FIG. 1 is a schematic cross-sectional view of a package substrate 1 in accordance with some embodiments of the present disclosure. As shown in FIG. 1, the package substrate 1 includes a circuit layer 20, a molding layer 30 and a sacrificial layer 50. The circuit layer 20 may include a plurality of conductive traces 22 and conductive pads 24. In some embodiments, the width of the conductive pad 24 may be wider than, but is not limited to be, the width of the conductive trace 22. The conductive traces 22 each may include a first surface 22S1, a second surface 22S2 opposite to the first surface 22S1, and an edge 22E connecting the first surface 22S1 to the second surface 22S2. Also, the conductive pads 24 each may include a first surface 24S1, a second surface 24S2 opposite to the first surface 24S1, and an edge 24E connecting the first surface 24S1 to the second surface 24S2. The conductive traces 22 and the conductive pads 24 may include conductive material such as metal including copper or the like.

The molding layer 30 has an upper surface 30U and a lower surface 30L opposite to the upper surface 30U. In some embodiments, the upper surface 30U may be a component side of the package substrate 1 for disposing electronic components such as die, and the lower surface 30L may be a solder side (ball side) of the package substrate 1 for disposing electrical conductors such as solders. The material of the molding layer 30 may include molding compound such as epoxy resin or the like, and fillers such as silicon oxide fillers dispensed in the molding compound. The circuit layer 20 may be at least partially embedded in the molding layer 30, and adjacent conductive traces 22 and/or conductive pads 24 may be spaced by the molding layer 30. The molding layer 30 may partially cover the conductive traces 22 and the conductive pads 24. The first surfaces 22S1 of the conductive traces 22 and the first surfaces 24S1 of the conductive pads 24 may be exposed from the upper surface 30U of the molding layer 30. In some embodiments, the edges 22E of the conductive traces 22 and the edges 24E of the conductive pads 24 may be partially or entirely covered by the molding layer 30. In some embodiments, the first surfaces 22S1 of the conductive traces 22 and the first surfaces 24S1 of the conductive pads 24 are disposed at the same horizontal level, and may be substantially coplanar. In some embodiments, the conductive pads 24 are thicker than the conductive traces 22, and a thickness T2 of the conductive pad 24 is greater than a thickness T1 of the conductive trace 22. Accordingly, the second surfaces 22S2 of the conductive traces 22 may be covered by the molding layer 30, while the second surfaces 24S2 of the conductive pads 24 may be exposed from the lower surface 30L of the molding layer 30.

Since the circuit layer 20 is embedded in the molding layer 30, the overall thickness of the circuit layer 20 and the molding layer 30 can be mainly decided by the thickness of the molding layer 30. In some embodiments, the thickness of the molding layer 30 is substantially equal to or thinner than 50 micrometers, thinner than 40 micrometers or even thinner to meet the thin thickness requirement.

In some embodiments, the first surface 24S1 and/or the second surface 24S2 of the conductive pad 24 are configured to receive electrical connectors such as solder balls, solder bumps, metal posts, metal pillars or the like. In some embodiments, the first surface 22S1 of the conductive trace 22 may be configured to receive electrical connectors such as solder balls, solder bumps, metal posts, metal pillars or the like.

In some embodiments, each of the conductive pads 24 may include a first portion 241 and a second portion 242 stacked on each other. The first portion 241 and the second portion 242 may include the same conductive material such as copper or the like. The first portion 241 and the second portion 242 may be in contact with each other, or connected through an intervening conductive layer. The first portion 241 may be wider than the second portion 242. The first portion 241 may include the first surface 24S1 of the conductive pad 24, and the second portion 242 may include the second surface 24S2 of the conductive pad 24. In some embodiments, the first portion 241 of the conductive pad 24 and the conductive traces 22 may be formed integrally by the same process, and may be substantially equal in thickness.

The sacrificial layer 50 covers the lower surface 30L of the molding layer 30, and the second surfaces 24S2 of the conductive pads 24. In some embodiments, there is no air gap between the second surfaces 24S2 of the conductive pads 24 and the sacrificial layer 50. By way of example, the second surfaces 24S2 of the conductive pads 24 and the sacrificial layer 50 are spaced with a gap, and an intermediate film 42 is disposed between the lower surface 30L of the molding layer 30 and the sacrificial layer 50, and between the second surfaces 24S2 of the conductive pads 24 and the sacrificial layer 50 to fill the gap. In some other embodiments, the sacrificial layer 50 and the second surfaces 24S2 of the conductive pads 24 may be in contact, and thus no air gap is formed between the second surfaces 24S2 of the conductive pads 24 and the sacrificial layer 50. Since no air gap is formed between the second surfaces 24S2 of the conductive pads 24 and the sacrificial layer 50, popcorn issue due to air bubbles during successive thermal process may be avoided. The intermediate film 42 may include a conductive film such as a copper film. In some embodiments, the sacrificial layer 50 may include a conductive layer such as a copper layer. The intermediate film 42 may be formed by electro-less plating, deposition or other suitable process. In some embodiments, the conductive layer may be formed by electroplating, and the intermediate film 42 may be configured as a seed layer for electroplating the sacrificial layer 50. In some embodiments, the sacrificial layer 50 includes an insulative layer such as a dry film. In some embodiments, the dry film may be attached to the lower surface 30L of the molding layer 30, and the intermediate film 42 may be configured as a release layer when detaching the dry film.

In some embodiments, the package substrate 1 is an intermediate product. The sacrificial layer 50 may be configured as a temporary enhancement layer to support the molding layer 30 and the circuit layer 20 having a thin thickness. The sacrificial layer 50 will be removed after dies and/or other components are formed on the upper surface 30U of the molding layer 30. The thickness of the sacrificial layer 50 can be selected to be less than, equal to or larger than the thickness of the molding layer 30 as long as the sacrificial layer 50 can provide sufficient support for the molding layer 30. Accordingly, the molding layer 30 and the circuit layer 20 supported by the sacrificial layer 50 can be handled during transportation and successive processes. By way of examples, a thickness sum of a thickness of the sacrificial layer and a thickness of the molding layer with the embedded circuit layer 20 is substantially equal to or greater than about 50 micrometers, equal to or greater than about 80 micrometers, substantially equal to or greater than about 90 micrometers, substantially equal to or greater than about 100 micrometers, substantially equal to or greater than about 110 micrometers, or even greater. In some embodiments, the overall thickness of the molding layer 30 and the embedded circuit layer 20 is ranging from about 20 micrometers to about 50 micrometers, and the thickness of the sacrificial layer 50 may be about one to five times the overall thickness of the molding layer 30 and the embedded circuit layer 20 such that the structural strength of the sacrificial layer 50 is sufficient to provide supporting force to the molding layer 30 and the embedded circuit layer 20. By way of an example, the overall thickness of the molding layer 30 and the embedded circuit layer 20 is about 20 micrometers, and the thickness of the sacrificial layer 50 is ranging from about 20 micrometers to about 100 micrometers.

Figure 2A:
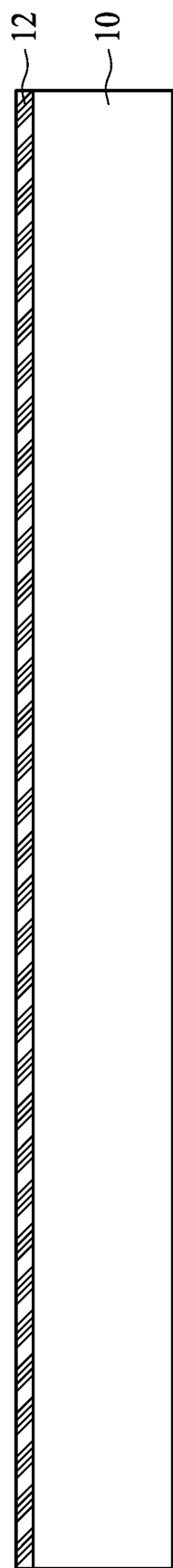
FIG. 2A, FIG. 2B, FIG. 2C, FIG. 2D, FIG. 2E, FIG. 2F, FIG. 2G, FIG. 2H and FIG. 2I illustrate operations of manufacturing a package substrate and a semiconductor device package in accordance with some embodiments of the present disclosure.

FIG. 2A, FIG. 2B, FIG. 2C, FIG. 2D, FIG. 2E, FIG. 2F, FIG. 2G, FIG. 2H and FIG. 2I illustrate operations of manufacturing a package substrate and a semiconductor device package in accordance with some embodiments of the present disclosure. As shown in FIG. 2A, a carrier 10 such as a glass carrier, a plastic carrier or a semiconductor carrier is provided. A seed layer 12 may be optionally formed on the carrier 10. The seed layer 12 may include a thin metal layer such as a thin copper layer formed by electro-less plating or other suitable process.

Figure 2B:
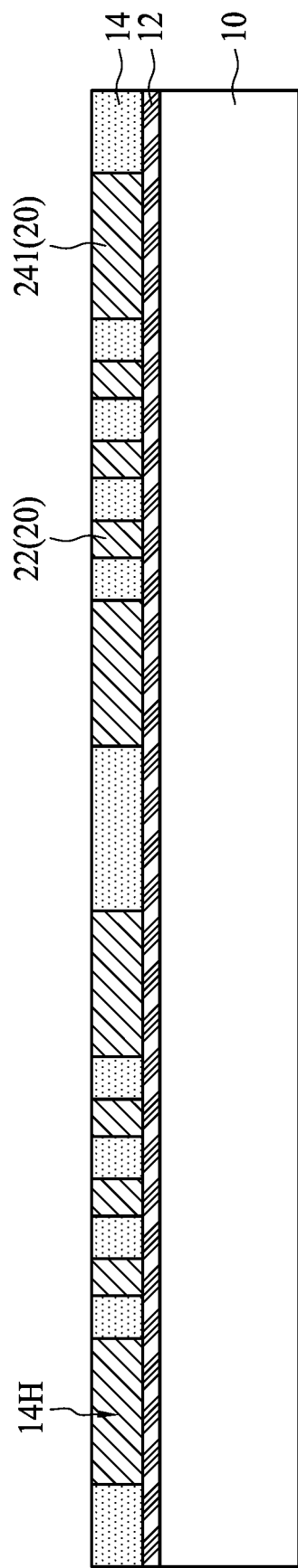
Figure 2C:
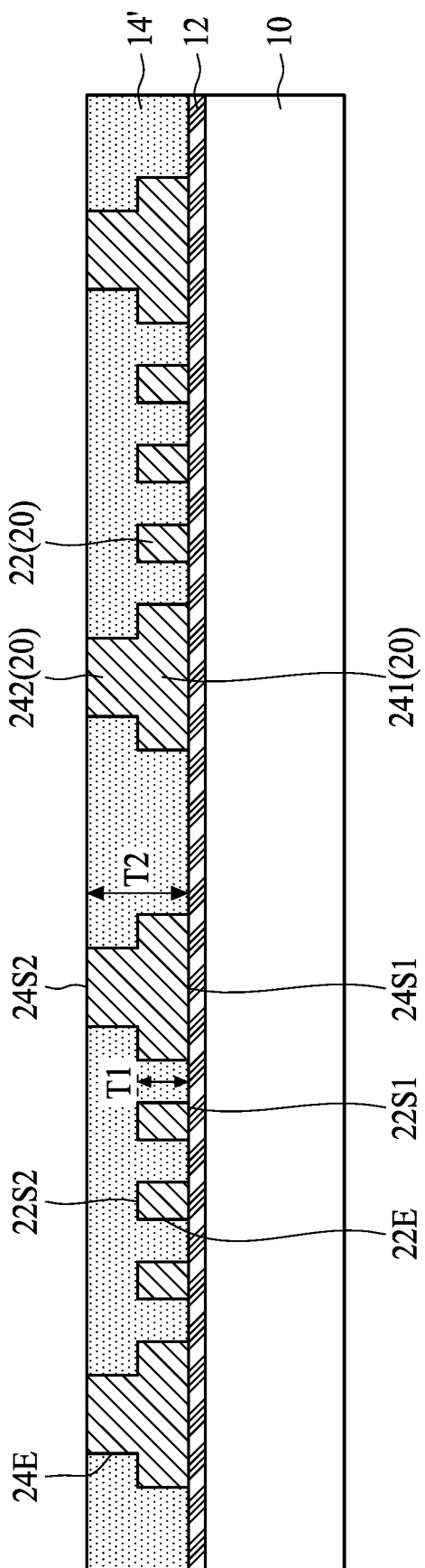

A circuit layer 20 is then formed on the carrier 10. In some embodiments, the circuit layer 20 is formed by the operations as illustrated in FIG. 2B and FIG. 2C. As shown in FIG. 2B, a plurality of conductive traces 22 and first portions 241 of conductive pads 24 are formed on the carrier 10. In some embodiments, a resist layer 14 with a plurality of openings 14H is formed on the carrier 10, and the conductive traces 22 and the first portions 241 of the conductive pads 24 are formed in the openings 14H. The resist layer 14 may include an optically-sensitive material such as a photoresist, and the openings 14H may be formed by exposure and development operations. The conductive traces 22 and the first portions 241 of the conductive pads 24 may be formed by the same electroplating on the seed layer 12. Therefore, the conductive traces 22 and the first portions 241 of the conductive pads 24 may be substantially equal in thickness. As shown in FIG. 2C, the resist layer 14 may be removed, and another resist layer 14' such as a photoresist layer may be formed on the carrier 10. The resist layer 14' may cover conductive traces 22 and expose the first portions 241 of the conductive pads 24, and second portions 242 of the conductive pads 24 may be formed on the exposed first portions 241 of the conductive pads 24 by electroplating, for example. In some embodiments, the second portion 242 is narrower than the first portion 241. The thickness T2 of the conductive pad 24 is greater than the thickness T1 of the conductive trace 22.

The conductive trace 22 may include a first surface 22S1 facing the carrier 10, and a second surface 22S2 opposite to the first surface 22S1. The first portion 241 of the conductive pad 24 may include a first surface 24S1 facing the carrier 10, and the second portion 242 of the conductive pad 24 may include a second surface 24S2 opposite to the first surface 24S1.

Figure 2D:
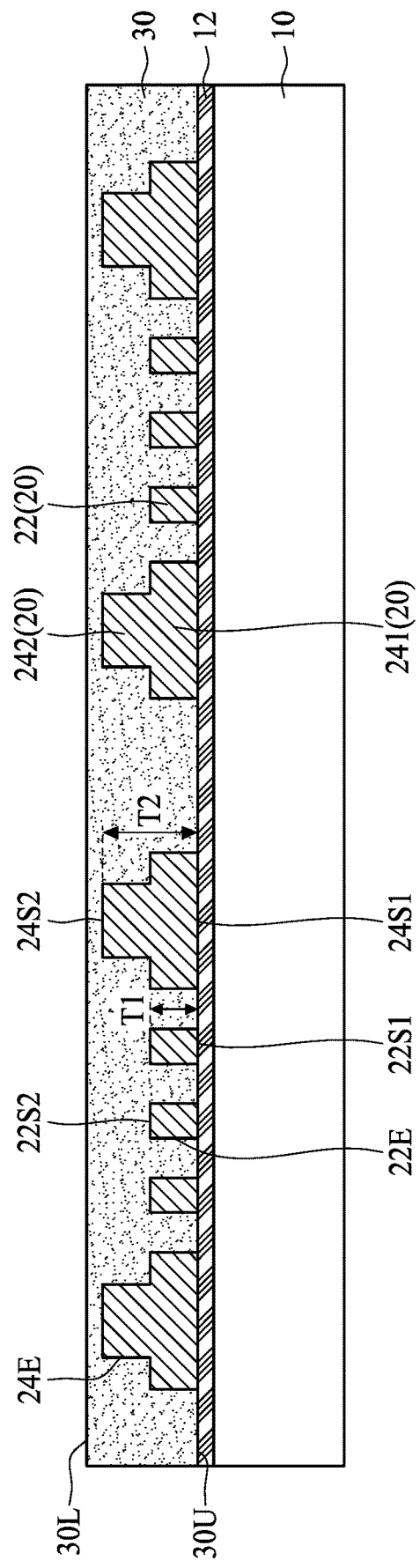

As shown in FIG. 2D, the resist layer 14' is removed. A molding layer 30 is formed on the carrier 10 to cover the conductive traces 22 and the conductive pads 24. The molding layer 30 may include molding compound such as epoxy and fillers such as silicon oxide fillers, and can be formed by molding operation with mold chase. The molding layer 30 includes an upper surface 30U facing the carrier 10, and a lower surface 30L opposite to the upper surface 30U.

Figure 2E:
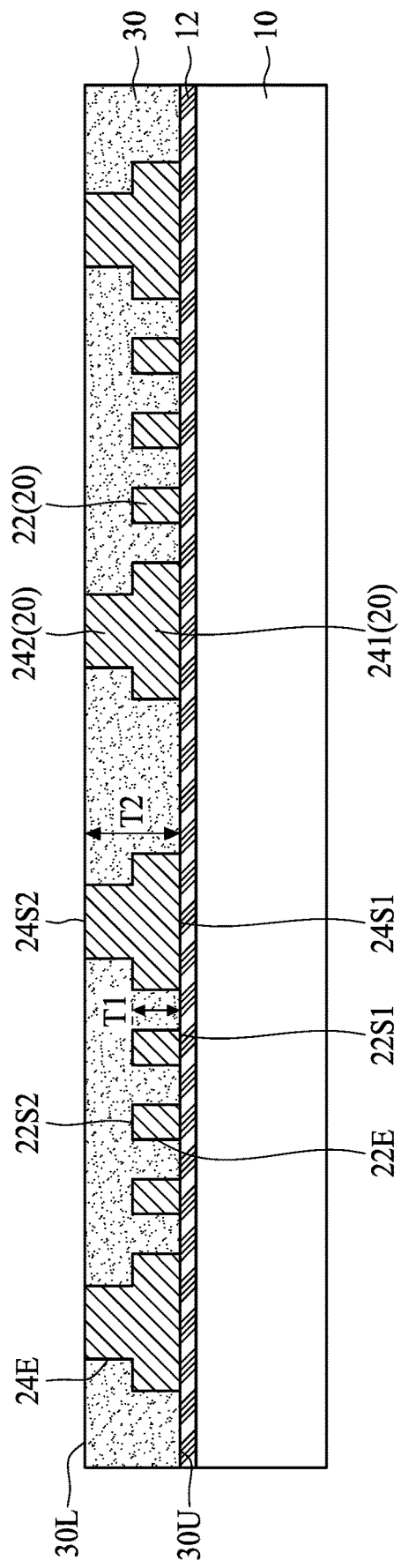

As shown in FIG. 2E, the molding layer 30 is thinned by e.g., grinding through the lower surface 30L to expose the second surfaces 24S2 of the conductive pads 24. The thickness difference between thickness T2 of the conductive pad and the thickness T1 of the conductive trace 22 is equal to or greater than a thickness tolerance of the grinding process such that the conductive trace 22 can be covered and protected by the molding layer 30 after the grinding process.

Figure 2F:
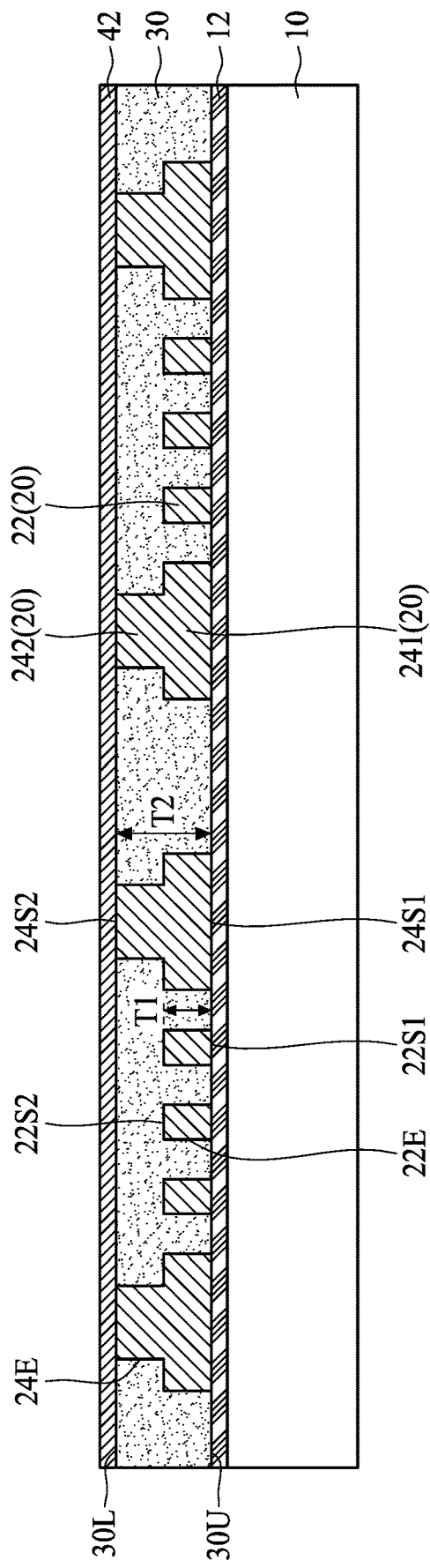

As shown in FIG. 2F, an intermediate film 42 may be optionally formed on the molding layer 30 and on the exposed conductive pads 24. The intermediate film 42 may be formed by electro-less plating, electroplating, deposition or other suitable process. In some embodiments, the intermediate film 42 may include a thin copper layer.

Figure 2G:
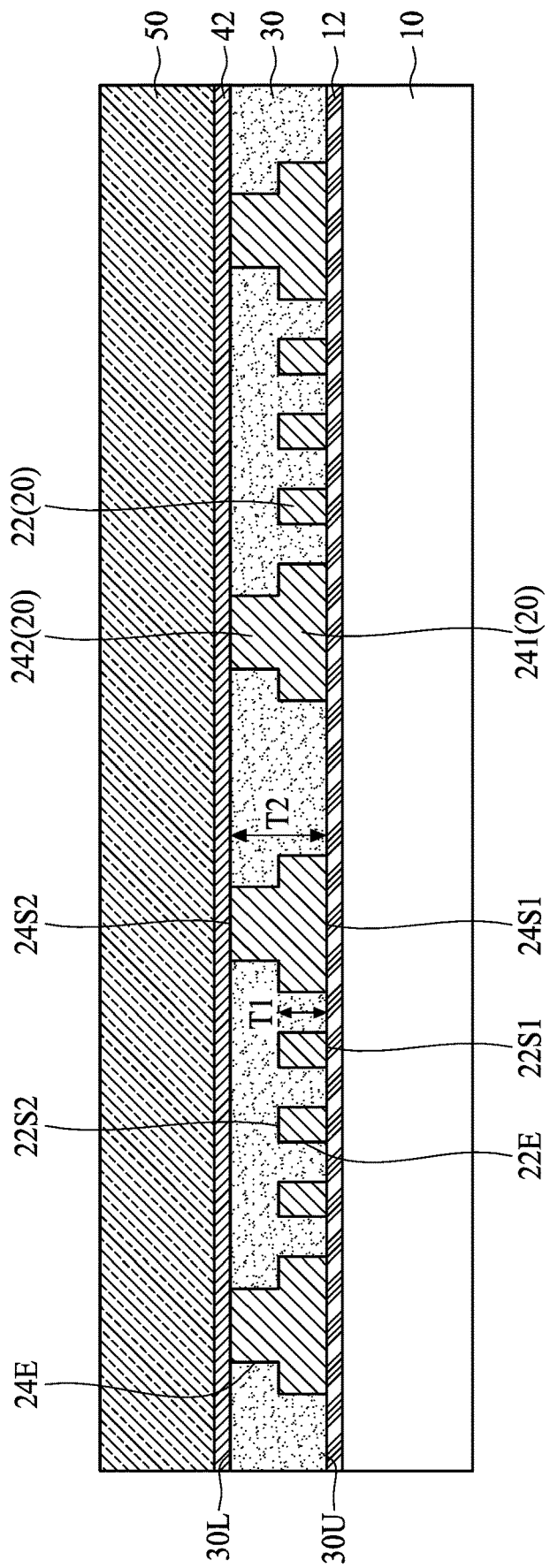

As shown in FIG. 2G, a sacrificial layer 50 is formed on the molding layer 30 and the intermediate film 42. In some embodiments, the sacrificial layer 50 includes a conductive layer such as a metal layer. By way of example, the conductive layer may include a copper layer. The copper layer may be formed by electroplating using the intermediate film 42 as a seed layer. In some other embodiments, the sacrificial layer 50 includes an insulative layer. By way of example, the insulative layer may include a dry film. The sacrificial layer 50 can help to support the molding layer 30 and the circuit layer 20, and thus the carrier 10 can be removed from the molding layer 30. In case the seed layer 12 exists, the upper surface 30U of the molding layer 30 can be treated by e.g., etching to remove the seed layer 12 to form the package substrate 1 as illustrated in FIG. 1. In some embodiments, the first surfaces 22S1 of the conductive traces 22 and the first surfaces 24S1 of the conductive pads 24 can be slightly lower than or coplanar with the upper surface 30U of the molding layer 30 after the surface treatment.

Figure 2H:
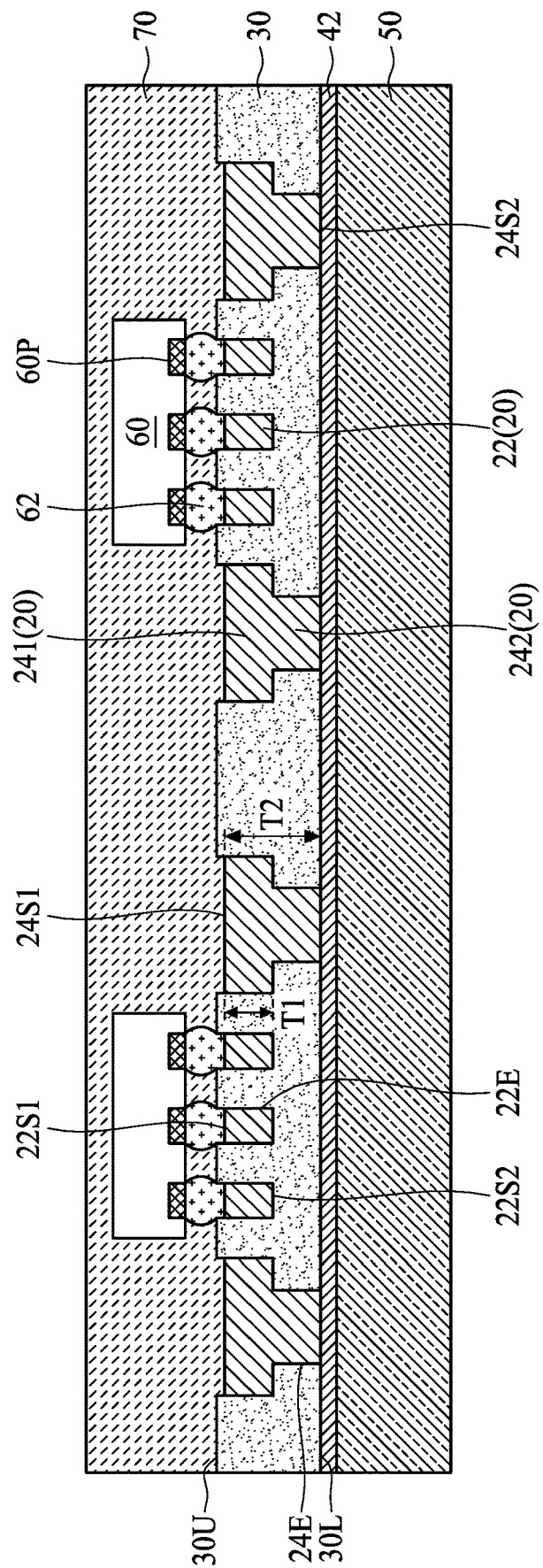

As shown in FIG. 2H, a plurality of dies 60 may be disposed on the molding layer 30 and electrically connected to the conductive traces 22. In some embodiments, the dies 60 are electrically connected to the circuit layer 20 in a flip-chip manner. For example, the die 60 may include electrical terminals 60P such as bonding pads facing the circuit layer 20, and electrically connected to the conductive traces 22 and/or the conductive pads 24 through conductive structures 62 such as solder bumps or the like. In some other embodiments, the die 60 may be electrically connected to the conductive traces 22 and/or the conductive pads 24 through wire bonding. A second molding layer 70 may be formed on the molding layer 30 to encapsulate the dies 60. The second molding layer 70 may include molding compound such as epoxy and fillers such as silicon oxide fillers, and can be formed by molding operation with mold chase. In some embodiments, the second molding layer 70 is in contact with the molding layer 30. The molding layer 30 and the second molding layer 70 may be made of homogeneous molding material similar in characteristics such as coefficient of thermal expansion (CTE), modulus of elasticity and the like. Accordingly, warpage and delamination issues can be alleviated.

In some embodiments, the intermediate film 42 is disposed between the lower surface 30L of the molding layer 30 and the sacrificial layer 50, and between the second surfaces 24S2 of the conductive pads 24 and the sacrificial layer 50. Accordingly, there may not be air gap formed between the second surfaces 24S2 of the conductive pads 24 and the sacrificial layer 50, and popcorn issue due to air bubbles during thermal process of bonding the die 60 and the circuit layer 20 with the conductive structures 62 may be avoided.

Figure 2I:
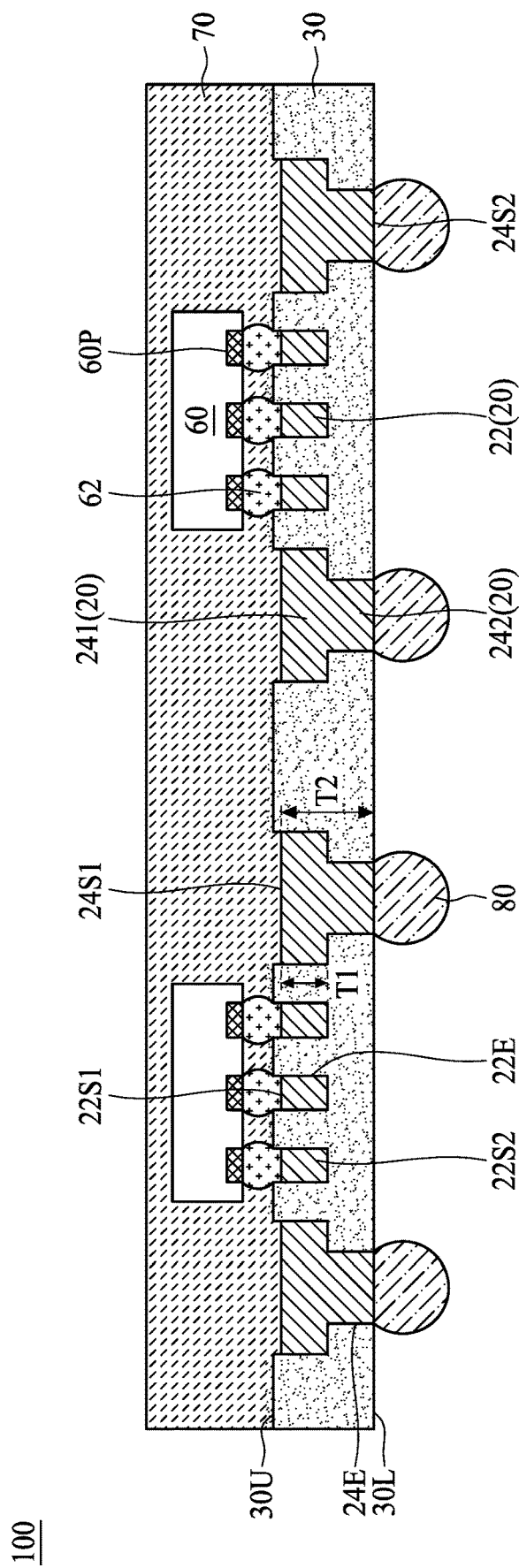

As shown in FIG. 2I, the sacrificial layer 50 and the intermediate film 42 are removed to expose the second surfaces 24S2 of the conductive pads 24. The intermediate film 42 and the sacrificial layer 50 may each be removed by etching, detaching or other suitable process. By way of example, the intermediate film 42 may include a conductive film such as a copper film, and can be removed by etching. In case the sacrificial layer 50 includes a conductive layer such as a copper layer, the conductive layer can be removed by etching. In case the sacrificial layer 50 is an insulative layer such as a dry film, the insulative layer can be removed by detaching, and residues of the insulative layer may be removed along with the intermediate film 42. A plurality of electrical conductors 80 such as solder balls may be formed on the second surfaces 24S2 of the conductive pads 24 to facilitate external electrical connection to an external electrical component such as a printed circuit board (PCB) or the like. A singulation can be carried out to segment the package substrate 1, the dies 60 and the second molding layer 70 into a plurality of semiconductor device packages 100.

The package substrate 1 includes the circuit layer 20 embedded in the molding layer 30, and thus the thickness of the package substrate 1 can be reduced. The circuit layer 20 and the molding layer 30 are temporarily supported by the sacrificial layer 50, which enhances the structural strength of the package substrate 1 and allows the package substrate 1 to be carried and handled in successive manufacturing operations. The sacrificial layer 50 can be removed after other electronic components such as semiconductor dies are disposed on the package substrate 1, and thus the overall thickness of the semiconductor device package 100 can be reduced.

The package substrates and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 3:
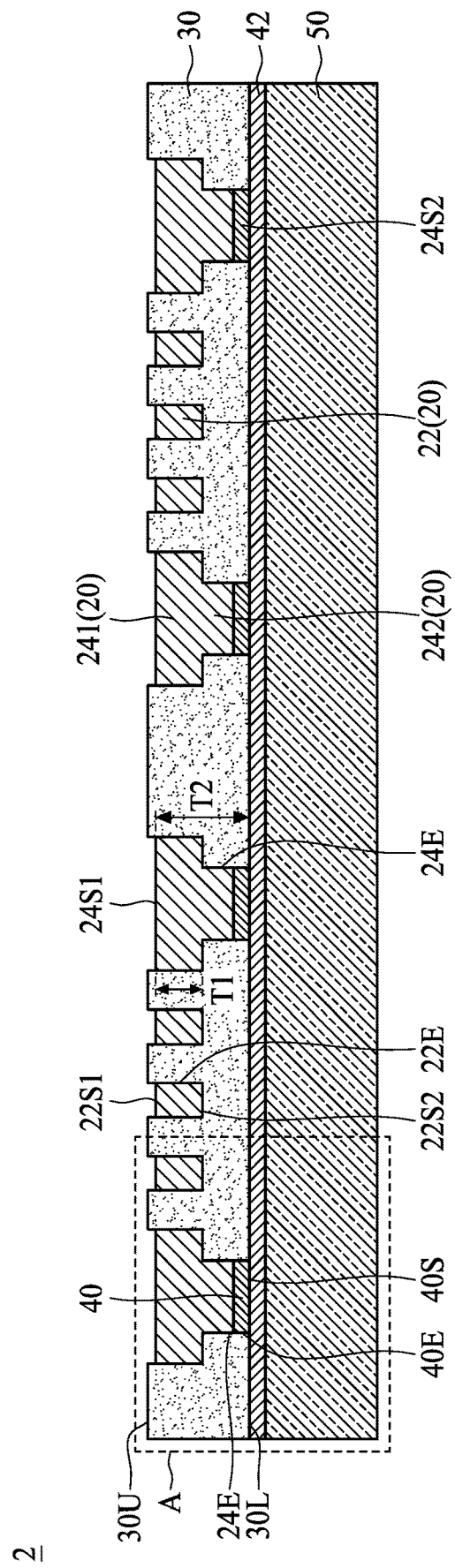
FIG. 3 is a schematic cross-sectional view of a package substrate in accordance with some embodiments of the present disclosure.

FIG. 3 is a schematic cross-sectional view of a package substrate 2 in accordance with some embodiments of the present disclosure. As shown in FIG. 3, in contrast to the package substrate 1 as illustrated in FIG. 1, the package substrate 2 may further include a plurality of pre-plated frames (PPFs) 40 disposed on the second surfaces 24S2 of the conductive pads 24, respectively. The material of the PPFs 40 is different from that of the sacrificial layer 50 such that the PPFs 40 and the sacrificial layer 50 may have distinct etching selectivity. Accordingly, the PPFs 40 may be configured as etching stop layers during etching the conductive layer, and the conductive pads 24 are not damaged during removal of the sacrificial layer 50. Examples of the material of the PPFs 40 may include, but is not limited to, nickel (Ni), palladium (Pd), gold (Au) or a combination thereof, and example of the material of the sacrificial layer 50 and the conductive pad 24 may include, but is not limited to, copper. The PPF 40 may be a single-layered structure including nickel (Ni), palladium (Pd), gold (Au) or an alloy thereof, or a multi-layered structure with layers each including nickel (Ni), palladium (Pd) or gold (Au). In some embodiments, the edges 40E of the pre-plated frames 40 are substantially aligned with the edges 24E of the conductive pads 24, respectively.

Figure 3A:
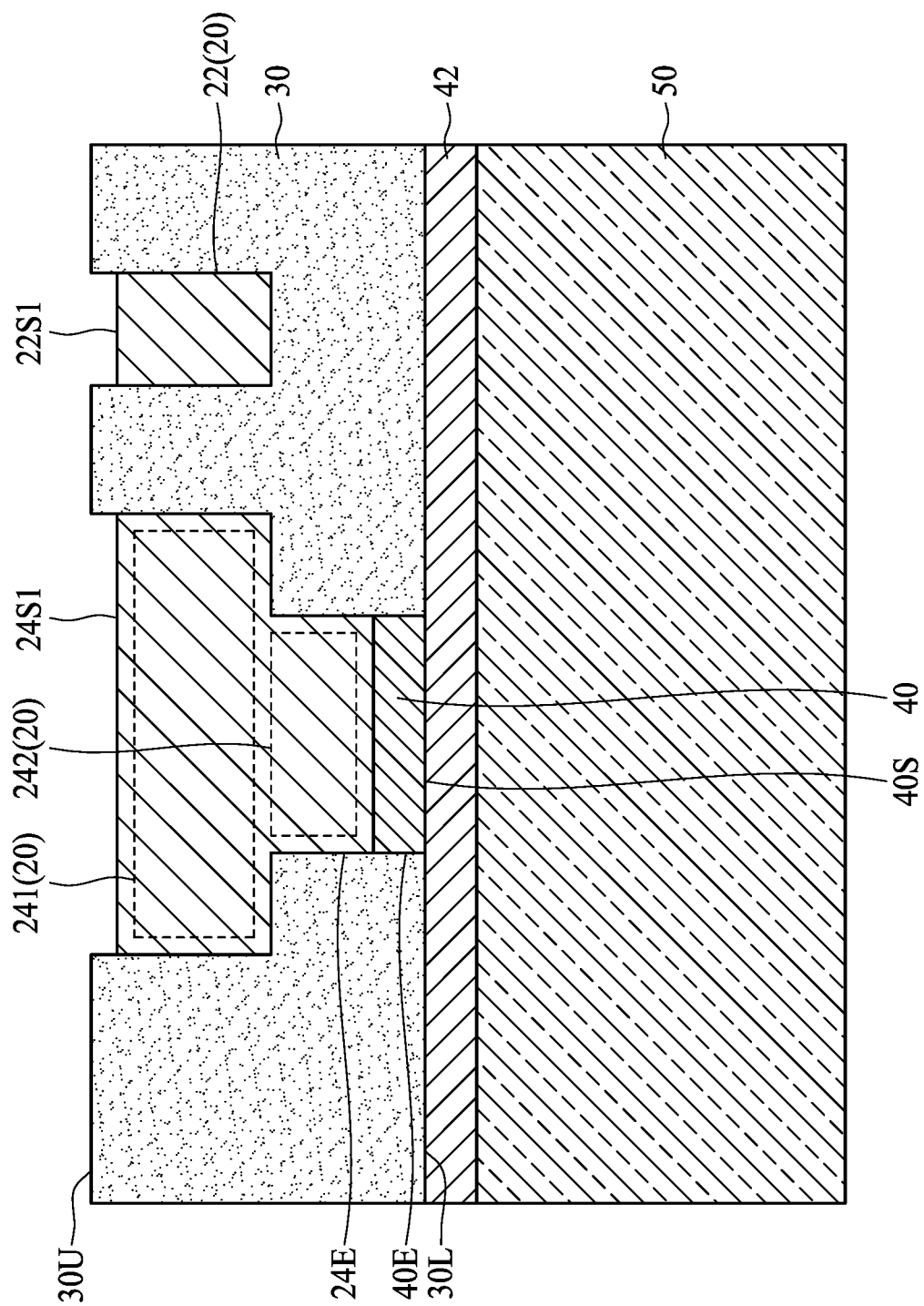
FIG. 3A, FIG. 3B and FIG. 3C are schematic cross-sectional views of region A of the package substrate in FIG. 2 in accordance with some embodiments of the present disclosure.
Figure 3B:
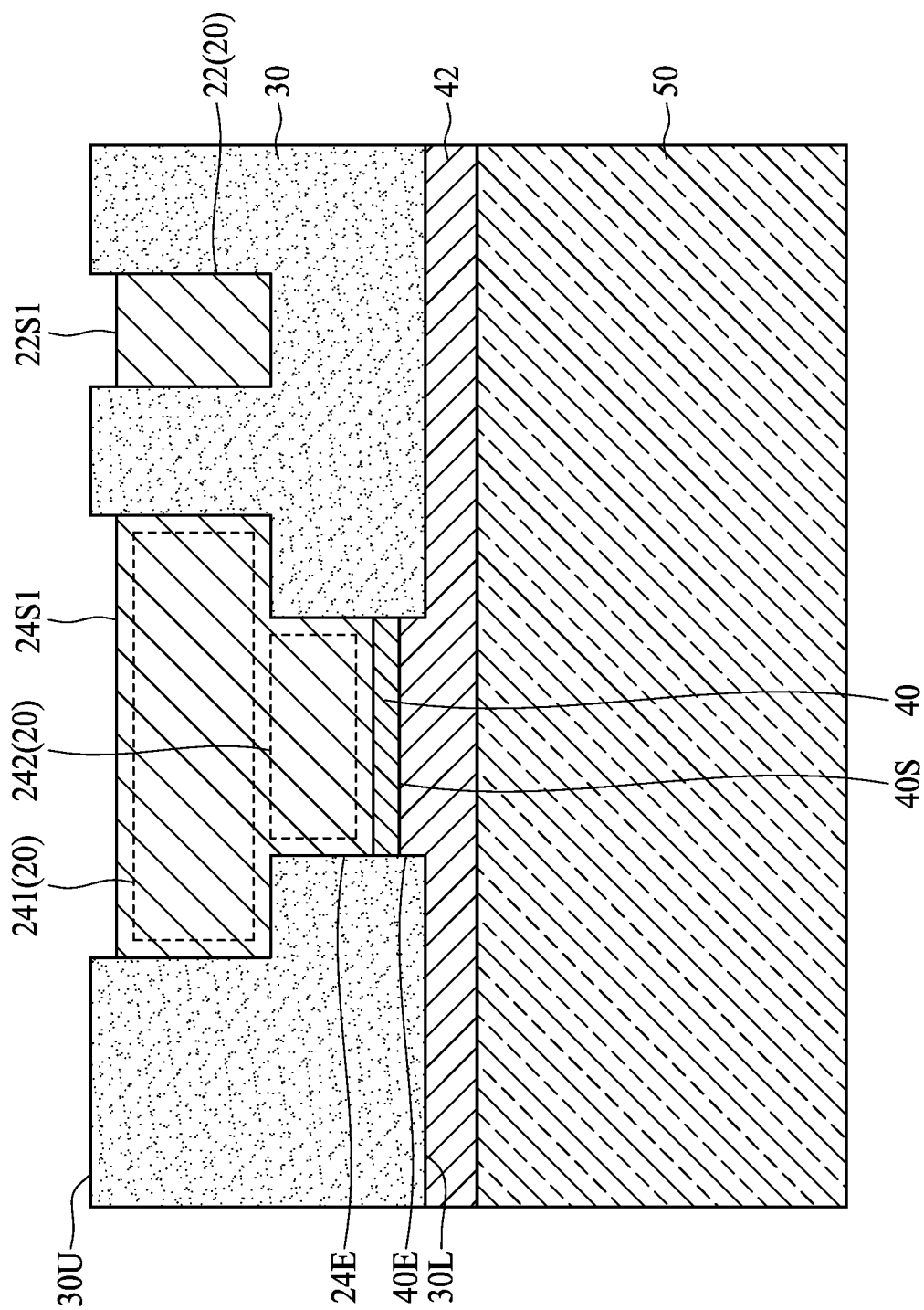
Figure 3C:
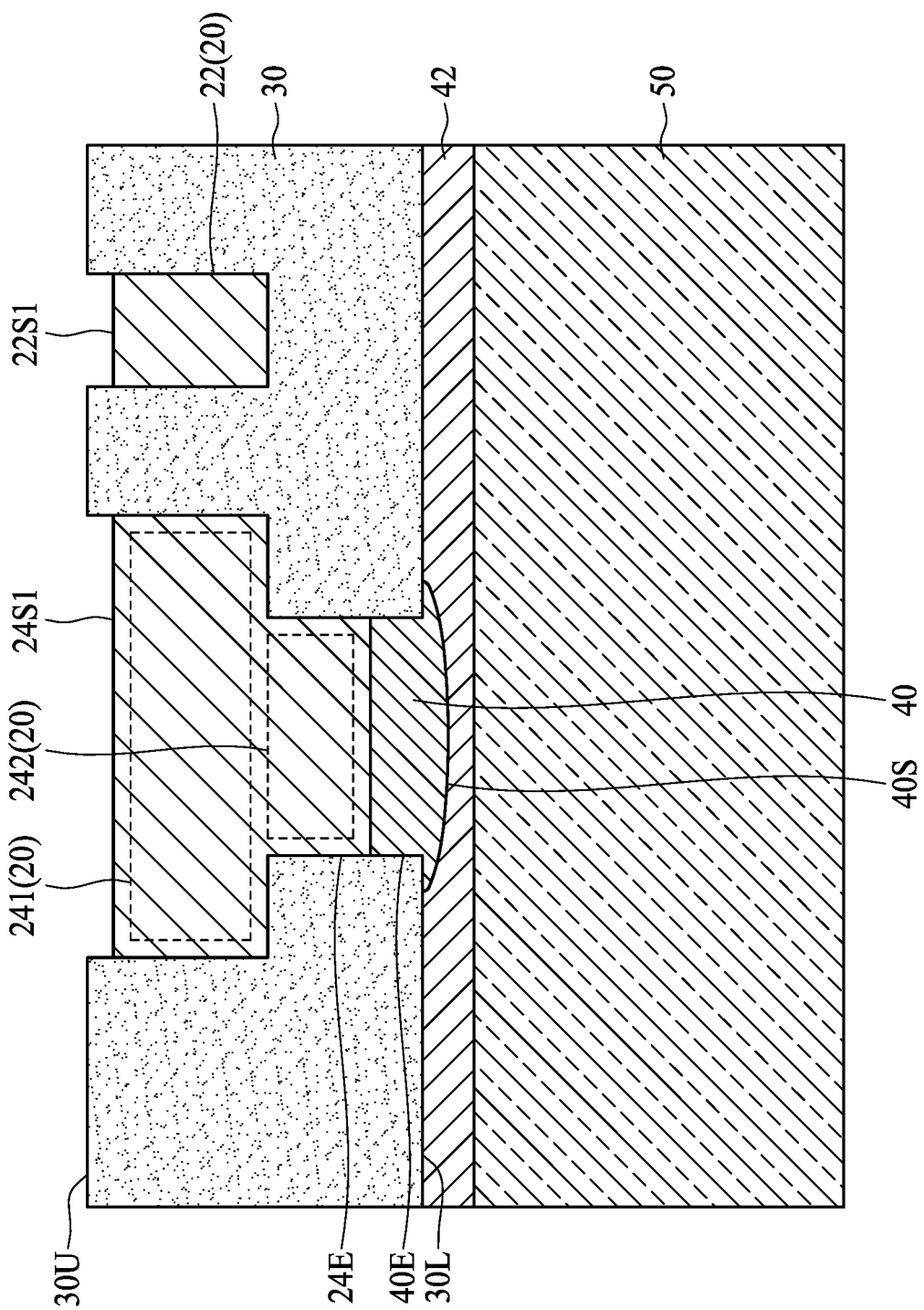

FIG. 3A, FIG. 3B and FIG. 3C are schematic cross-sectional views of region A of the package substrate 2 in FIG. 2 in accordance with some embodiments of the present disclosure. As shown in FIG. 3A, the surfaces 40S of the PPFs 40 may be substantially coplanar with the lower surface 30L of the molding layer 30. As shown in FIG. 3B, the surfaces 40S of the PPFs 40 may be substantially lower than the lower surface 30L of the molding layer 30. As shown in FIG. 3C, the surfaces 40S of the PPFs 40 may be substantially higher than the lower surface 30L of the molding layer 30. In some embodiments, the surface 40S of the PPF 40 may include a convex surface, and the PPFs 40 may further partially cover the lower surface 30L of the molding layer 30.

Figure 4A:
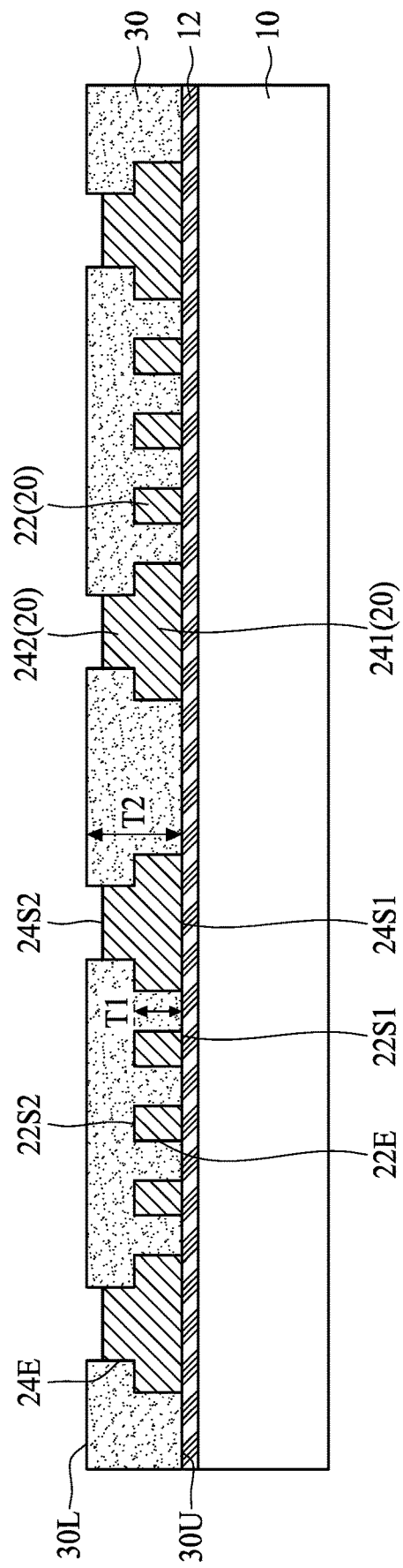
FIG. 4A, FIG. 4B, FIG. 4C, FIG. 4D and FIG. 4E illustrate operations of manufacturing a package substrate and a semiconductor device package in accordance with some embodiments of the present disclosure.

FIG. 4A, FIG. 4B, FIG. 4C, FIG. 4D and FIG. 4E illustrate operations of manufacturing a package substrate and a semiconductor device package in accordance with some embodiments of the present disclosure. As shown in FIG. 4A, a seed layer 12, a circuit layer 20 and a molding layer 30 may be formed on a carrier 10. The seed layer 12, the circuit layer 20 and the molding layer 30 may be formed by operations similar to that illustrated in FIG. 2A-FIG. 2E. In some embodiments, the second surfaces 24S2 of the conductive pads 24 may be slightly recessed from the lower surface 30L of the molding layer 30. In some other embodiments, the second surfaces 24S2 of the conductive pads 24 may be substantially coplanar with the lower surface 30L of the molding layer 30.

Figure 4B:
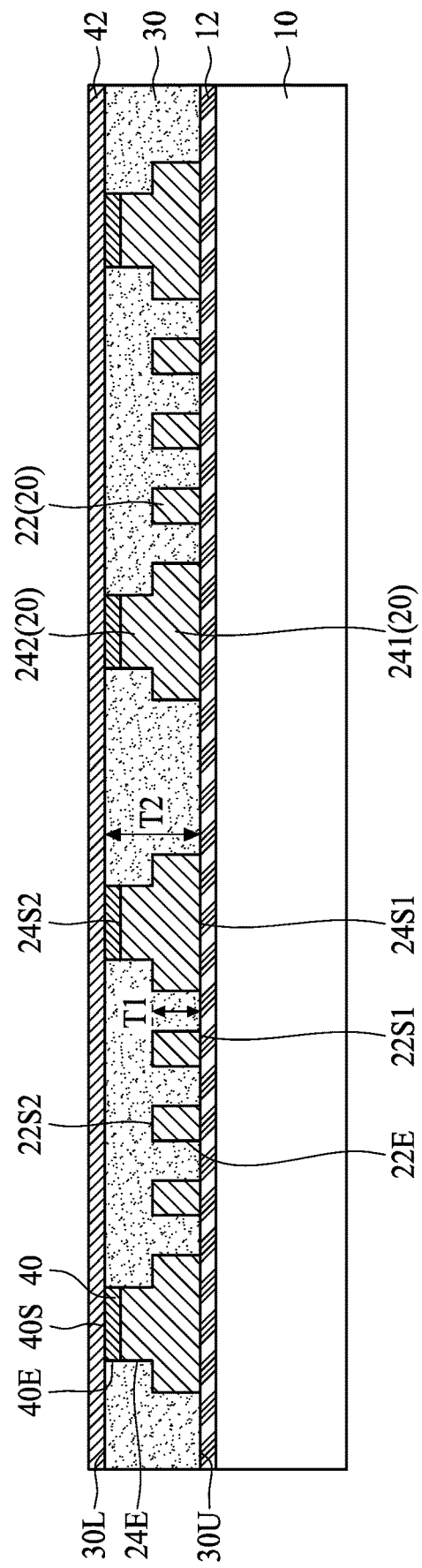

As shown in FIG. 4B, a plurality of PPFs 40 are formed respectively on the exposed second surfaces 24S2 of the conductive pads 24 prior to formation of the sacrificial layer 50. The PPFs 40 may be formed by electroplating or other suitable process. In some embodiments, an intermediate film 50 may be optionally formed on the molding layer 30 and on the PPFs 40.

Figure 4C:
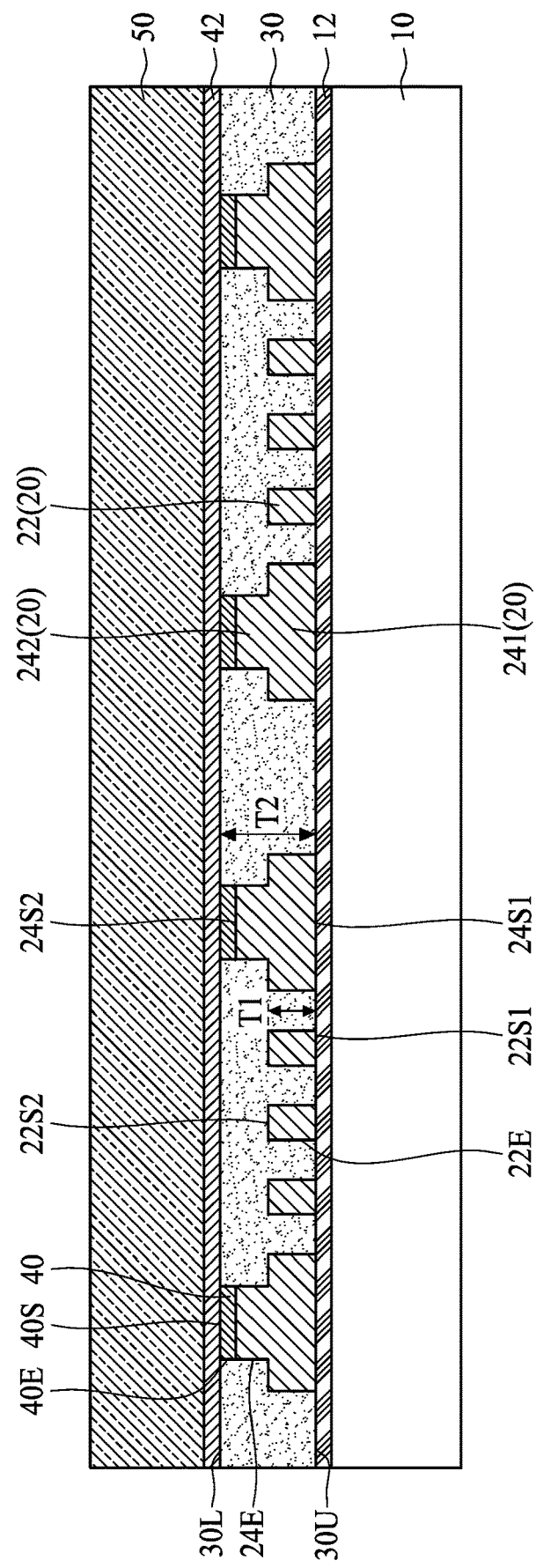

As shown in FIG. 4C, a sacrificial layer 50 is formed on the intermediate film 50. In some embodiments, the sacrificial layer 50 includes a conductive layer such as a copper layer. The copper layer may be formed by electroplating using the intermediate film 42 as a seed layer. In some embodiments, the sacrificial layer 50 includes an insulative layer such as a dry film, and the dry film can be attached to the intermediate film 42. The sacrificial layer 50 can help to support the molding layer 30 and the circuit layer 20, and thus the carrier 10 can be removed from the molding layer 30. In case the seed layer 12 exists, the upper surface 30U of the molding layer 30 can be treated by e.g., etching to remove the seed layer 12 to form the package substrate 2 as illustrated in FIG. 3. In some embodiments, the first surfaces 22S1 of the conductive traces 22 and the first surfaces 24S1 of the conductive pads 24 can be slightly lower than or coplanar with the upper surface 30U of the molding layer 30 after the surface treatment.

Figure 4D:
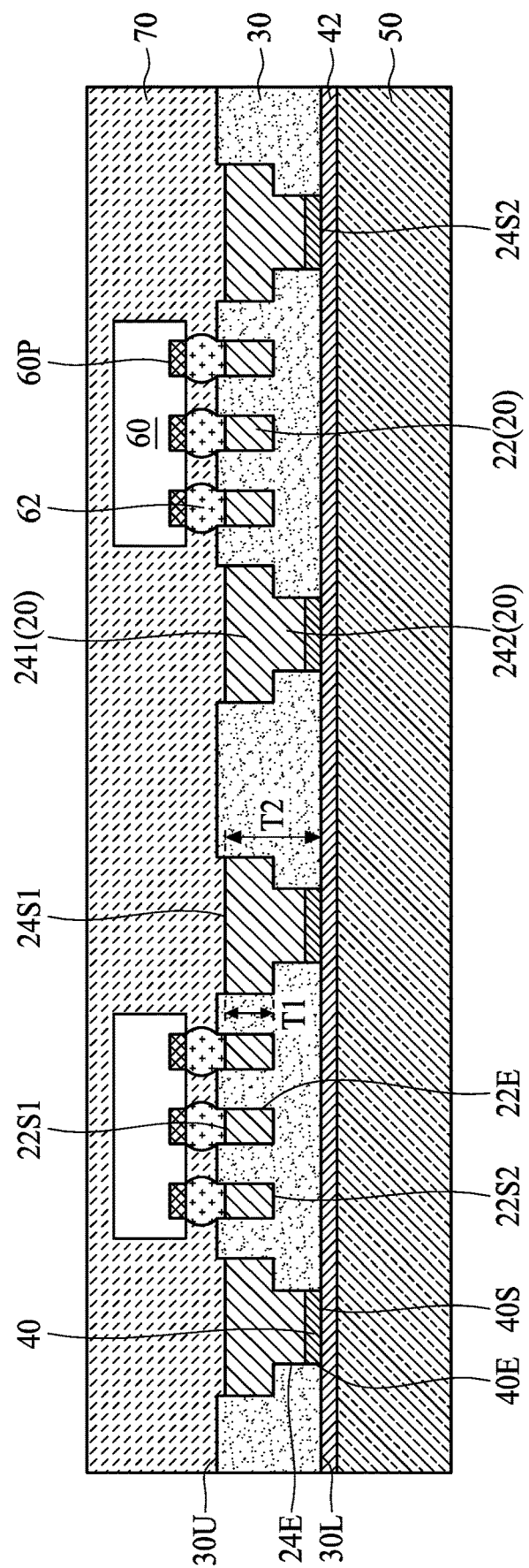

As shown in FIG. 4D, a plurality of dies 60 may be disposed on the molding layer 30 and electrically connected to the conductive traces 22 and/or the conductive pads 24. In some embodiments, the dies 60 are electrically connected to the circuit layer 20 in a flip-chip manner. For example, the die 60 may include electrical terminals 60P such as bonding pads facing the circuit layer 20, and electrically connected to the conductive traces 22 through conductive structures 62 such as solder bumps or the like. In some other embodiments, the die 60 may be electrically connected to the conductive traces 22 and/or the conductive pads 24 through wire bonding. A second molding layer 70 may be formed on the molding layer 30 to encapsulate the dies 60. The second molding layer 70 may include molding compound such as epoxy and fillers such as silicon oxide fillers, and can be formed by molding operation with mold chase. In some embodiments, the second molding layer 70 is in contact with the molding layer 30. The molding layer 30 and the second molding layer 70 may be made of homogeneous molding material similar in characteristics such as coefficient of thermal expansion (CTE), modulus of elasticity and the like. Accordingly, warpage and delamination issues can be alleviated.

Figure 4E:
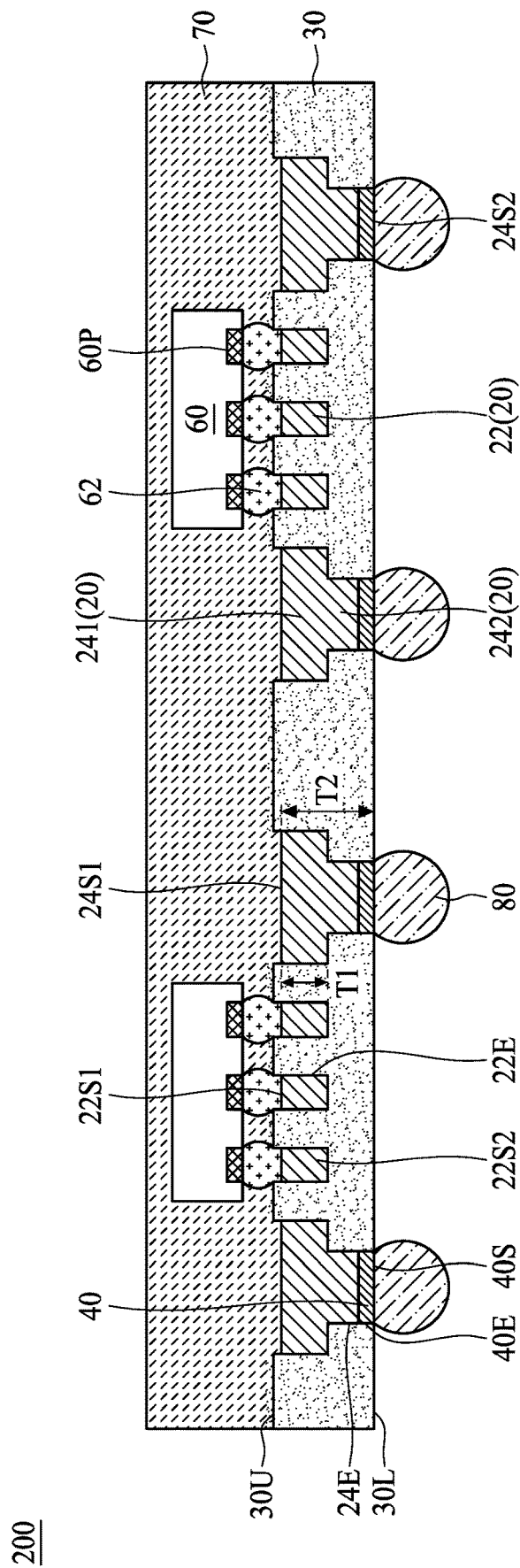

As shown in FIG. 4E, the sacrificial layer 50 and the intermediate film 42 are removed to expose the PPFs 40. The intermediate film 42 and the sacrificial layer 50 may each be removed by etching, detaching or other suitable process. In some embodiments, the intermediate film 42 may include a conductive film such as a copper film, and can be removed by etching.

In case the sacrificial layer 50 includes a conductive layer such as a copper layer, the conductive layer can be removed by etching. The material of the PPFs 40 is different from that of the sacrificial layer 50 and the intermediate film 42 such that the PPFs 40 may have an etching selectivity distinct from that of the sacrificial layer 50 and the intermediate film 42. Accordingly, the PPFs 40 may be configured as etching stop layers during etching the sacrificial layer 50 or the intermediate film 42, and the conductive pads 24 are not damaged during removal of the sacrificial layer 50 or the intermediate film 42. Examples of the material of the PPFs 40 may include, but is not limited to, nickel (Ni), palladium (Pd), gold (Au) or a combination thereof, and example of the sacrificial layer 50 and the conductive pad 24 may include may include, but is not limited to, copper. The PPF 40 may be a single-layered structure including nickel (Ni), palladium (Pd), gold (Au) or an alloy thereof, or a multi-layered structure with layers each including nickel (Ni), palladium (Pd) or gold (Au). In case the sacrificial layer 50 is an insulative layer such as a dry film, the insulative layer can be removed by detaching, and residues of the insulative layer may be removed along with the intermediate film 42.

A plurality of electrical conductors 80 such as solder balls may be formed on the PPFs 40 to facilitate external electrical connection to an external electrical component such as a printed circuit board (PCB) or the like. A singulation can be carried out to segment the package substrate 1, the dies 60 and the second molding layer 70 into a plurality of semiconductor device packages 200.

In some embodiments of the present disclosure, the package substrate includes a circuit layer embedded in a molding layer, and thus the thickness of the package substrate can be reduced. The circuit layer and the molding layer are temporarily supported by a sacrificial layer, which enhances the structural strength of the package substrate and allows the package substrate to be carried and handled in successive manufacturing operations. The sacrificial layer can be removed after other electronic components such as semiconductor dies are disposed on the package substrate, and thus the overall thickness of the semiconductor device package can be reduced.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A package substrate, comprising:
a circuit layer, comprising a conductive trace and a conductive pad;
a molding layer encapsulating the circuit layer, the molding layer having a top surface and a bottom surface opposite to the top surface,
wherein a top surface of the conductive trace and a top surface of the conductive pad are entirely recessed from the top surface of the molding layer,
wherein the top surface of the molding layer has an opening exposing the conductive pad, wherein an inner surface of the opening is substantially aligned with a lateral surface of the conductive pad in a cross-sectional view; and
a sacrificial layer covering the bottom surface of the molding layer,
wherein a bottom surface of the conductive pad is exposed from the bottom surface of the molding layer,
wherein the conductive pad is T-shaped in the cross-sectional view and the top surface of the conductive pad is wider than the bottom surface of the conductive pad,
wherein the molding layer is a monolithic structure,
wherein the bottom surface of the conductive pad is entirely recessed from the bottom surface of the molding layer.

2. A package substrate, comprising:
a circuit layer, comprising a conductive trace and a conductive pad;
a molding layer encapsulating the circuit layer, the molding layer having a top surface and a bottom surface opposite to the top surface,
wherein a top surface of the conductive trace and a top surface of the conductive pad are entirely recessed from the top surface of the molding layer,
wherein the top surface of the molding layer has an opening exposing the conductive pad, wherein an inner surface of the opening is substantially aligned with a lateral surface of the conductive pad in a cross-sectional view; and
a sacrificial layer covering the bottom surface of the molding layer,
wherein a bottom surface of the conductive pad is exposed from the bottom surface of the molding layer,
wherein the conductive pad is T-shaped in the cross-sectional view and the top surface of the conductive pad is wider than the bottom surface of the conductive pad,
wherein the molding layer is a monolithic structure,
wherein a bottom surface of the conductive trace is not exposed from the bottom surface of the molding layer.

3. The package substrate of claim 2, wherein the sacrificial layer comprises a metal.

4. The package substrate of claim 2, further comprising an seed layer disposed between the bottom surface of the molding layer and the sacrificial layer, wherein the seed layer is in contact with the sacrificial layer.

5. The package substrate of claim 4, further comprising an etching stop layer embedded in the molding layer and in contact with the seed layer.

6. The package substrate of claim 5, wherein the etching stop layer extends into the seed layer.

7. The package substrate of claim 5, wherein a width of the etching stop layer is substantially the same as a width of the bottom surface of the conductive pad in a sectional view.

8. The package substrate of claim 5, wherein the etching stop layer does not extend beyond the bottom surface of the molding layer.

9. The package substrate of claim 2, wherein the top surface of the conductive trace is entirely exposed from the top surface of the molding layer.

10. A package substrate, comprising:
a monolithic molding layer having a top surface and a bottom surface opposite to the top surface;
a circuit structure embedded in the molding layer and comprising at least one conductive pad,
wherein a top surface of the at least one conductive pad is exposed and entirely recessed from the top surface of the molding layer, wherein a bottom surface of the at least one conductive pad is exposed and entirely recessed from the bottom surface of the molding layer,
wherein the circuit structure further comprises at least one conductive trace embedded in the molding layer,
wherein a top surface of the at least one conductive trace is exposed and entirely recessed from the top surface of the molding layer,
wherein a bottom surface of the at least one conductive trace is not exposed from the molding layer;
a die disposed over the top surface of the molding layer,
wherein in a sectional view, the die does not overlap the conductive pad; and
a solder in contact with the top surface of the conductive trace and the die,
wherein no solder is in contact with the top surface of the at least one conductive pad.

11. The package substrate of claim 10, further comprising a second molding layer disposed on the top surface of the molding layer and extending into the molding layer.

12. The package substrate of claim 11, wherein the second molding layer is in contact with the top surface of the at least one conductive pad.

13. The package substrate of claim 11, further comprising an electrical connector disposed on the bottom surface of the at least one conductive pad, wherein the die does not overlap the electrical connector in a sectional view.

* * * * *